United States Patent
Ide et al.

(10) Patent No.: US 8,646,959 B2
(45) Date of Patent: Feb. 11, 2014

(54) LASER LIGHT SOURCE

(75) Inventors: Masafumi Ide, Tokorozawa (JP);
Shinpei Fukaya, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 411 days.

(21) Appl. No.: 13/014,415

(22) Filed: Jan. 26, 2011

(65) Prior Publication Data

US 2011/0182082 A1     Jul. 28, 2011

(30) Foreign Application Priority Data

Jan. 27, 2010  (JP) .................................. 2010-015458
Jan. 12, 2011  (JP) .................................. 2011-004411

(51) Int. Cl.
*F21V 7/04*         (2006.01)

(52) U.S. Cl.
USPC .......................................... 362/553; 362/583

(58) Field of Classification Search
USPC ........................................................ 362/553
See application file for complete search history.

(56) References Cited

U.S. PATENT DOCUMENTS

| | | | | |
|---|---|---|---|---|
| 5,387,998 | A | * | 2/1995 | Kitaoka et al. ................ 359/328 |
| 5,724,126 | A | * | 3/1998 | Nishi et al. .................... 356/73.1 |
| 2009/0041410 | A1 | * | 2/2009 | De Barros et al. ............. 385/28 |
| 2010/0054661 | A1 | * | 3/2010 | Ramachandran .............. 385/28 |
| 2010/0079753 | A1 | * | 4/2010 | Hehlen ......................... 356/301 |

FOREIGN PATENT DOCUMENTS

| | | |
|---|---|---|
| JP | 2003-270686 A | 9/2003 |
| WO | 2007/057974 A1 | 5/2007 |

\* cited by examiner

*Primary Examiner* — William Carter
(74) *Attorney, Agent, or Firm* — Sughrue Mion, PLLC

(57) ABSTRACT

A laser light source includes a laser element that outputs a fundamental wave; a wavelength conversion element to which the fundamental wave is input and that wavelength-converts at least a portion of the input fundamental wave to a converted wave having a wavelength shorter than the fundamental wave; a first waveguide that guides an output wave from the wavelength conversion element; a second waveguide that attenuates and guides a component of the fundamental wave included in the output wave from the first waveguide; a diffraction grating that is formed in the first waveguide and locks a wavelength or a frequency of the fundamental wave output from the laser element by feeding back the fundamental wave output from the wavelength conversion element.

19 Claims, 11 Drawing Sheets

LASER LIGHT SOURCE

BACKGROUND OF THE INVENTION

1. Field of the Invention

The present invention relates to a wavelength-conversion laser light source that includes a wavelength conversion element.

2. Description of the Related Art

A laser light source outputs a near-infrared (NIR) fundamental wave. Meanwhile, a technology for wavelength conversion to a visible wavelength to output a second harmonic (a converted wave) is disclosed in, for example, Japanese Laid-Open Patent Publication No. 2003-270686 (page 2, FIG. 1). Japanese Laid-Open Patent Publication No. 2003-270686 describes a configuration of a fiber-pigtailed laser light source in which light output from a laser diode LD is input to and oscillated by a polarization maintaining fiber in which a fiber bragg grating (FBG) is formed. The fundamental wave is converted to the converted wave by a wavelength conversion element arranged on a path for wavelength locking.

However, the conventional technology described above has a problem in that a fundamental wave that has not been converted by the wavelength conversion element is output from the polarization maintaining fiber since the polarization maintaining fiber functions as a part of an oscillator. A filter has to be provided to remove the fundamental wave from the output light, and a lens has to be further provided between the LD and the polarization maintaining fiber, thereby inhibiting size reductions.

To solve the problem described above, an object of the present invention is to provide a small laser light source that can efficiently perform wavelength conversion and output a converted wave from which the component of the fundamental wave is removed.

SUMMARY OF THE INVENTION

A laser light source according to one aspect of the present invention includes a laser element that outputs a fundamental wave; a wavelength conversion element to which the fundamental wave is input and that wavelength-converts at least a portion of the input fundamental wave to a converted wave having a wavelength shorter than the fundamental wave; a first waveguide that guides an output wave from the wavelength conversion element; a second waveguide that attenuates and guides a component of the fundamental wave included in the output wave from the first waveguide; a diffraction grating that is formed in the first waveguide and locks a wavelength or a frequency of the fundamental wave output from the laser element by feeding back the fundamental wave output from the wavelength conversion element.

DETAILED DESCRIPTION OF THE PREFERRED EMBODIMENTS

Preferred embodiments of a laser light source according to the present invention are described in detail below with reference to the accompanying drawings.

(Embodiment)

Figure 1:
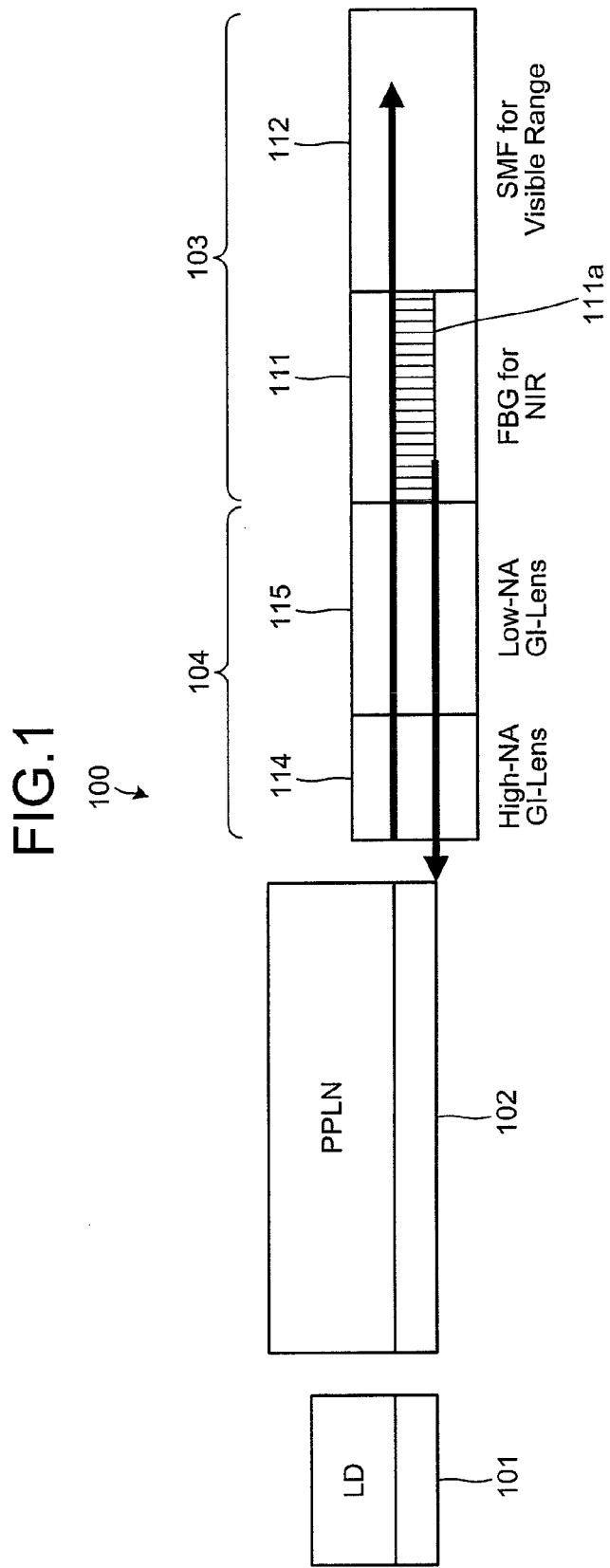
FIG. 1 is a diagram of a configuration of a laser light source according to an embodiment.

FIG. 1 is a diagram of a configuration of a laser light source according to an embodiment of the present invention. A laser light source 100 is a second-harmonic-generation (SHG) laser light source that includes a wavelength conversion element 102 and outputs a second harmonic. The laser light source 100 is configured by an LD 101, a wavelength conversion element 102, an optical fiber 103 as a waveguide, and a GI lens 104 as a coupling member.

The LD 101 outputs a laser light of a near-infrared fundamental wave (1064nm). Periodically poled lithium niobate (PPLN) is used as the wavelength conversion element 102, and the fundamental wave output from the LD 101 is input into the wavelength conversion element 102. The fundamental wave propagates through the wavelength conversion element 102, and is converted to the second harmonic (SH) (the converted wave).

The optical fiber 103 as the waveguide is configured by an optical fiber 111 as a first waveguide and an optical fiber for visible light 112 as a second waveguide. The optical fiber 111 has a diameter for guiding the fundamental wave in single mode (SM), and a diffraction grating (a fiber bragg grating (FBG)) 111a is formed in the optical fiber 111. The reflectance of the FBG 111a with respect to the fundamental wave is preferably 50 to 100%.

On the other hand, the optical fiber for visible light 112 has a diameter for guiding the converted wave in single mode (SM). Thus, the fundamental wave cannot be coupled to the core mode of the optical fiber for visible light 112, and the optical fiber for visible light 112 operates as a high-pass filter and attenuates the component of the fundamental wave included in the output wave of the optical fiber 111. That is, the optical fiber for visible light 112 has a function of wavelength selection for allowing only the converted wave to propagate.

For example, Corning HI1060 is used as the optical fiber 111 as the first waveguide, while Nufern 460HP is used as the optical fiber for visible light 112 as the second waveguide. The optical fiber 111 and the optical fiber for visible light 112 may be configured by polarization maintaining fibers.

The optical fiber for fundamental wave 111 in which the FBG 111a is formed has a different core diameter from that of the optical fiber for visible light 112. Thus, the adhered portion of the cores of the optical fibers 111 and 112 are tapered, thereby minimizing the reflection of the converted wave.

By the way, a part of the fundamental wave from the LD 101 passes through the wavelength conversion element 102 as it is, is coupled to the FBG 111a formed in the optical fiber 111 via the coupling member 104, and partially reflected due to frequency (wavelength) selection. The frequency (wavelength) of the LD 101 is locked by this feedback. In this embodiment, the reflection band of the FBG 111a matches the wavelength of the converted wave from the wavelength conversion element 102, thereby enabling a highly efficient wavelength conversion.

The GI lens 104 as the coupling member is provided on the input side of the optical fiber 103. The GI lens 104 is used for converting a small mode field diameter from the wavelength conversion element 102 to a mode field diameter larger than the wavelength conversion element 102. The GI lens 104 is configured by two GI lenses 114 and 115 formed by graded-index or gradient-index (GI) optical fibers. A general-purpose lens, for example, "SiGRIN" produced by TOYO GLASS CO., LTD. can be used as the GI lens 104. The first GI lens 114 located on the side of the wavelength conversion element 102 has a large numeric aperture NA1, while the second GI lens 115 has a numeric aperture NA2 smaller than the first GI lens 114. The GI lens 104 is formed by two short multi-mode fibers having a large and a small NAs, respectively, and operates as a compound lens.

The GI lens 104 is designed so that the converted wave is coupled to the core of the optical fiber 111 highly efficiently. However, even in the near-infrared region of the fundamental wave, the GI lens 104 operates as a lens to the core of the optical fiber for IR 111 in which the FBG 111a is formed, and achieves a relatively high coupling efficiency in the reflection band of the FBG 111a. Thus, by GI lenses 114 and 115 optimized for the converted wave, the mode field of the converted wave converted by and output from the wavelength conversion element 102 can be coupled with great efficiently to the facet of the optical fiber 111 in which the FBG 111a is formed. The optical fibers 111 and 112 and the GI lenses 114 and 115 are adhered and connected to be integral. The FBG 111a depicted in FIG. 1 is formed along the entire length of the optical fiber 111. However, as necessary, there may be a section where the FBG 111a is not formed.

If the GI lens 104 (GI lenses 114 and 115) described above are configured by separate lenses for spatial optical system, similar to the conventional technology, a large and complicated optical system is required to compensate a large wavelength dispersion between the IR region of the fundamental wave and the visible light region of the converted wave. In contrast, a small and highly efficient SHG laser light source with the function of frequency (wavelength) locking can be easily realized by using the GI lenses 114 and 115 described in this embodiment.

The GI lenses 114 and 115, the optical fiber 111 in which the FBG 111a is formed, and the optical fiber for visible light 112 have the same diameter (for example, 125 μmφ), and adhered and fixed. The adhered and fixed GI lenses 114 and 115 and optical fibers 111 and 112 are fixed in, for example, the same V-shaped groove or ferrule as described later, and can be configured to be integral so that mechanical deformation is suppressed and the number of elements is minimized.

The light-input surface of the coupling member, that is, the tip of the GI lens 104 is covered by an anti-reflection film (AR coat, etc.) for preventing reflection of the fundamental wave and the converted wave. Further, the tip (the input surface) of the GI lens 104 may be formed so as to be skewed with respect to the optical axis, or to have a sphere, thereby reducing the surface reflection at the input surface, and suppressing unnecessary light other than a given wavelength reflected by the FBG 111a from being reflected to the LD 101. In the above configuration, the wavelength of the fundamental wave is 1064nm, while the wavelength after the wavelength conversion by the wavelength conversion element 102 is 532nm. However, the present invention can be applied to a configuration in which wavelength conversion is performed using other wavelengths.

Figure 2:
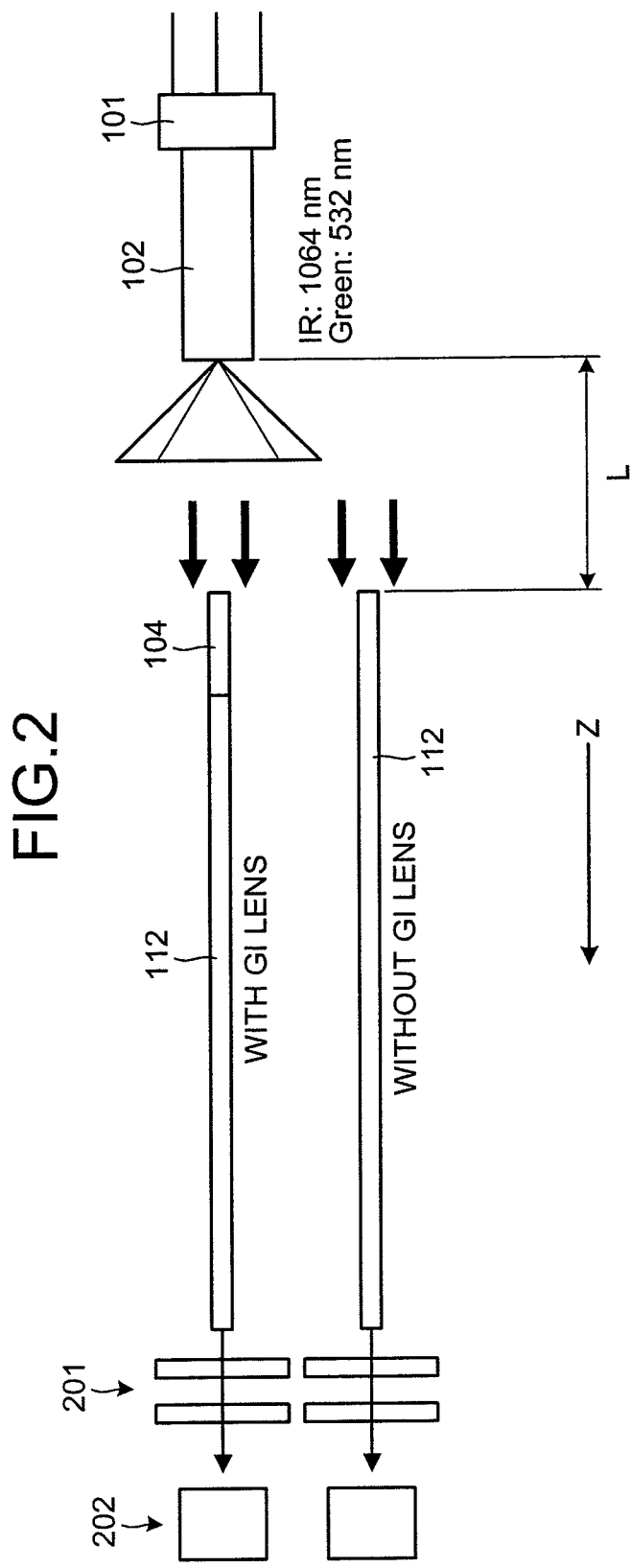
FIG. 2 is a diagram of an evaluation system for measuring the coupling characteristics depending on presence/absence of GI lens.

FIG. 2 is a diagram of an evaluation system for measuring the coupling characteristics depending on presence/absence of GI lens. The output of the wavelength conversion element and the coupling efficiency with the optical fiber are evaluated for a case in which the GI lens 104 described above is used and a case in which the GI lens 104 is not used. "L" in the figure represents the distance between the wavelength conversion element 102 and the optical fiber 112 along the optical axis Z. In the sample for evaluation, Nufern 460HP is used as the optical fiber and "SiGRIN" for 532nm produced by TOYO GLASS CO., LTD. described above is used as the GI lens 104. Nufern 460HP corresponds to the optical fiber for visible light 112 described above, and is a single-mode fiber (SMF) having a core diameter of about 3.5 μm.

As the evaluation system, an NIR-cut filter 201 (HAF-50S-15H produced by SIGMA KOKI Co., LTD.) is arranged on the output side of the optical fiber 112, and the optical power is detected by a power meter 202. The LD 101 outputs a fundamental wave having a wavelength of 1064nm, and the wavelength conversion element (PPLN) 102 outputs a converted light of 532nm to the optical fiber 112.

Figure 3:
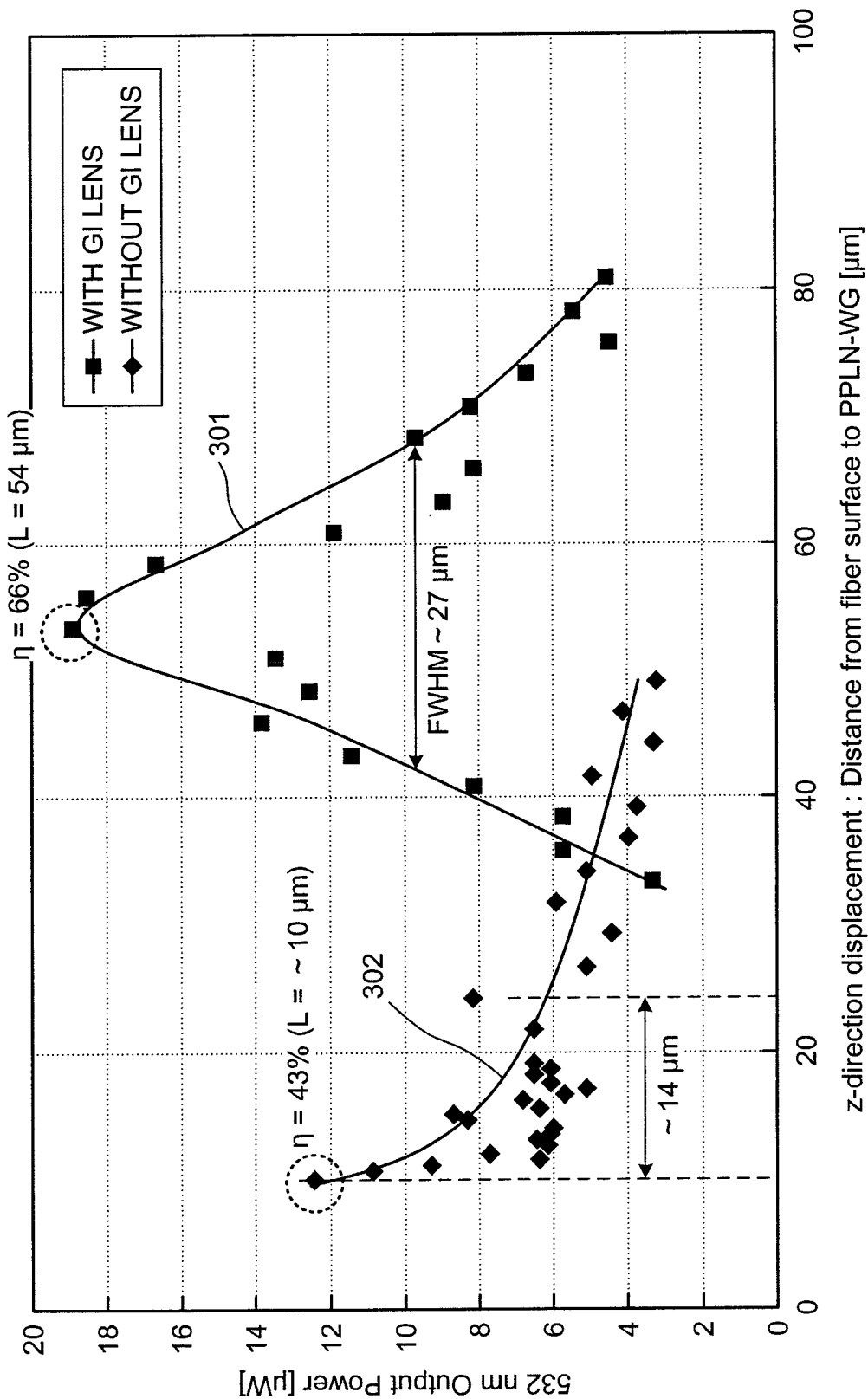
FIG. 3 is a chart of the characteristics of position on the optical axis Z versus output power with respect to the converted light measured by the evaluation system depicted in FIG. 2.

FIG. 3 is a chart of the characteristics of the position on the optical axis Z versus the output power with respect to the converted light measured by the evaluation system depicted in FIG. 2. Characteristics 301 with the GI lens 104 and characteristics 302 without the GI lens 104 are depicted. The result of measurement indicates that the maximum coupling efficiency in the characteristics 302 without the GI lens is 43% since the elements cannot be directly coupled and gaps are provided in between due to the manufacturing error of elements, and the distance L maximizing the coupling efficiency is 10 μm. The distance at which the output becomes half with respect to the value at the distance L is about 14 μm. In contrast, the maximum coupling efficiency in the characteristics 301 with the GI lens is 66% (the full width at half maximum (FWHM) is 27 μm), and the distance L maximizing the coupling efficiency is 54 μm.

As seen from the result of measurement, the coupling efficiency is low if the GI lens 104 is not used since gaps have to be provided when manufacturing the actual laser structure by YAG welding, etc. Further, the distance L between the wavelength conversion element 102 and the optical fiber 112 has to be made as short as possible, and thus a collision of the wavelength conversion element 102 and the optical fiber 112 can occur due to manufacturing error, optical axis adjustment, etc. In contrast, the coupling efficiency is high and the distance L can be made relatively long if the GI lens 104 is provided on the optical fiber 112. Thus, a tolerance between the wavelength conversion element 102 and the optical fiber 112 can be ensured, thereby allowing manufacturing error and preventing a collision during optical axis adjustment.

(First Exemplary Module Configuration of Laser Light Source)

Figure 4:
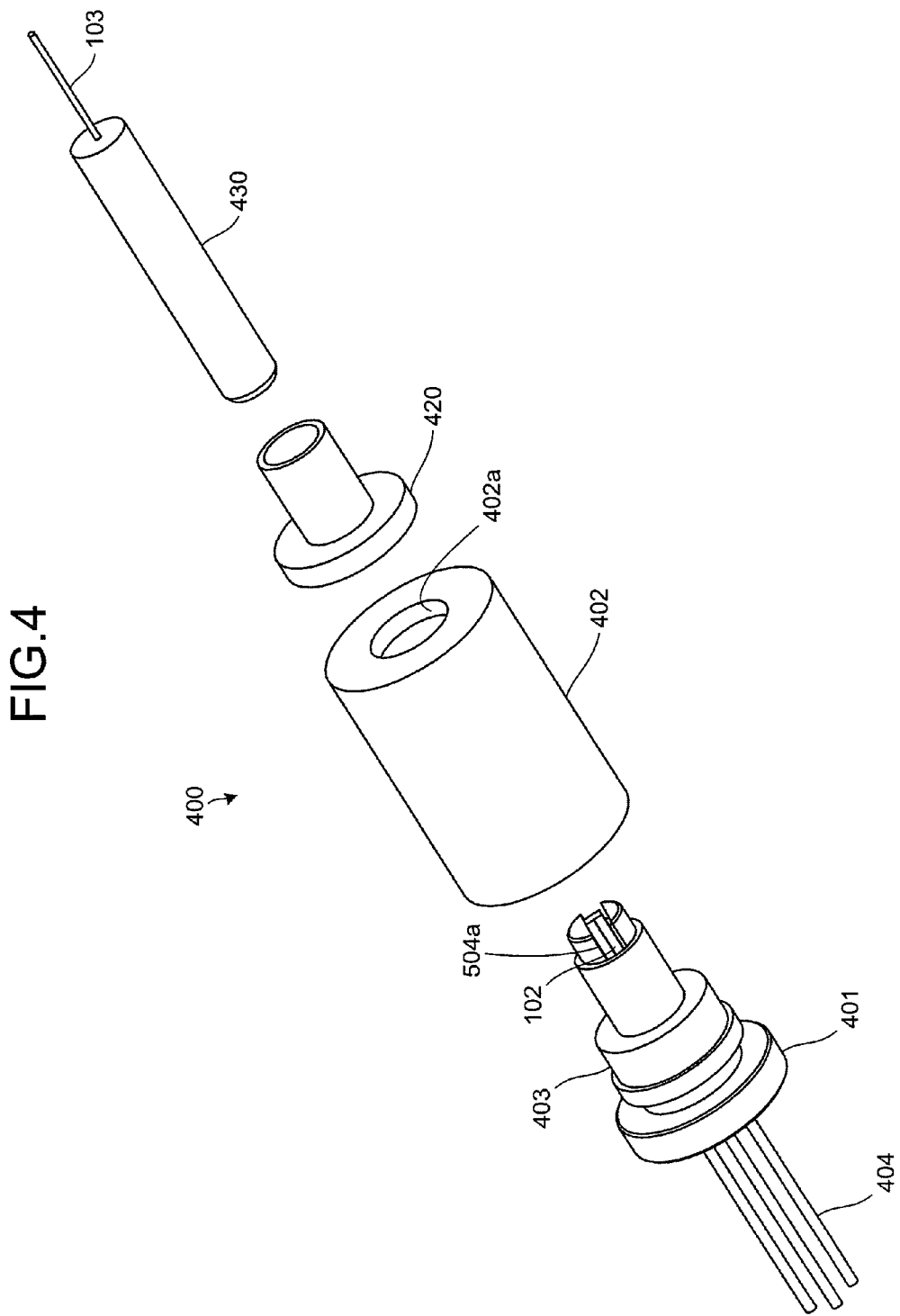
FIG. 4 is an exploded perspective view of an exemplary module configuration of the laser light source.
Figure 5:
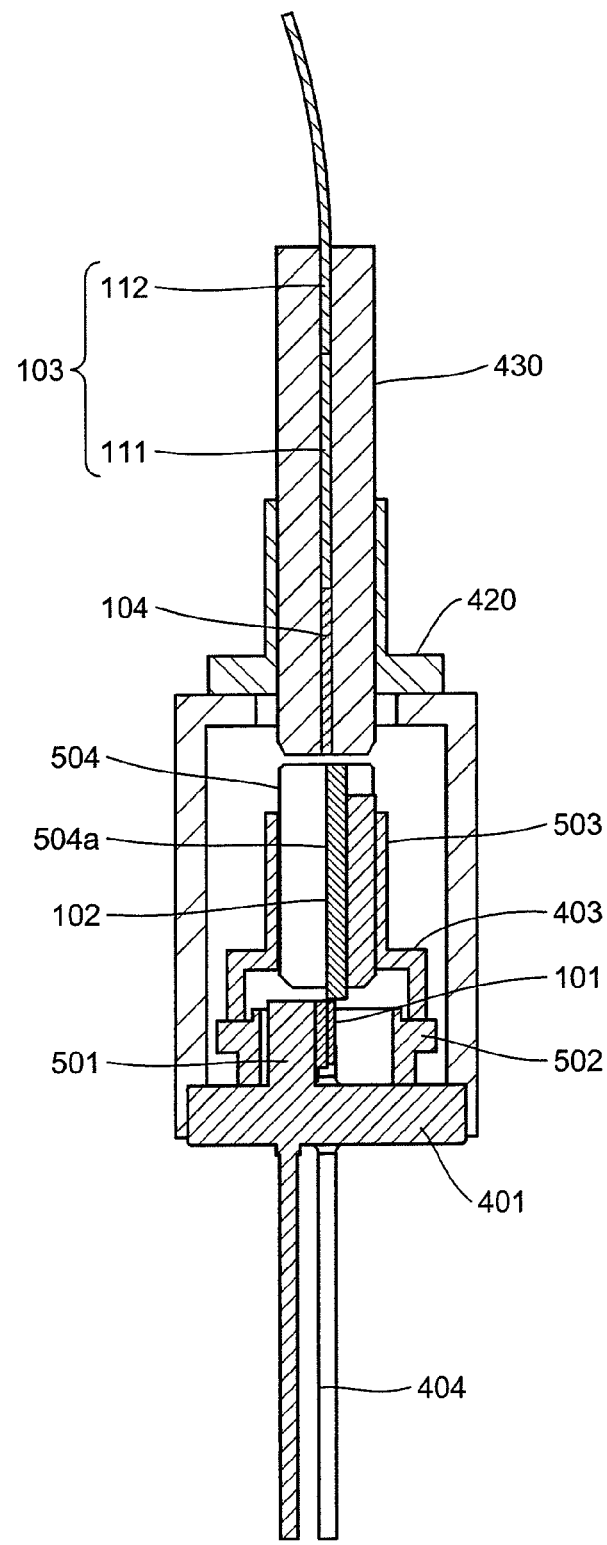
FIG. 5 is a side cross-section of the exemplary module configuration of the laser light source.

An example of a module of the laser light source described above is described next. FIG. 4 is an exploded perspective view of an exemplary module configuration of the laser light source. FIG. 5 is a side cross-section of the exemplary module configuration of the laser light source. As depicted in FIGS. 4 and 5, a laser light source module 400 is shaped as a transistor outline-can (TO-can) package made of SUS, for example, and a base 401 is equipped with a cap 402. The cap 402 is formed to be cylindrical, and has an opening 402a on the upper surface to which a ferrule 430 is installed via a flange 420 made of SUS, for example. The ferrule 430 is made of, for example, zirconia forming a hollow capillary in which the GI lens 104 and the tip of the optical fiber 103 described above are fixed and a SUS member that covers the zirconia. The SUS member that covers the zirconia and the flange 420 that is similarly made of SUS are fixed by, for example, YAG laser welding.

Since the GI lens 104, a section of the optical fiber for IR 111 where the FBG 111a is formed, and the edge portion of the optical fiber for visible light 112 are fixed in the ferrule 430 as described above, mechanical deformation of the GI lens 104, the optical fiber for IR 111, and the optical fiber for visible light 112 can be suppressed, and the lowest-order waveguide mode of the converted wave that has propagated through the core of the optical fiber for IR 111 can be efficiently coupled to the lowest-order mode of the core of the optical fiber for visible light 112 with little loss.

The LD 101 and the wavelength conversion element 102 implemented on a sub-mount in the holder 403 are provided on the base 401 in the holder 403. Lead terminals 404 for driving the laser light source are formed on the base 401 and protrude therefrom.

The base 401 is made of, for example, SPC or kover and the surface thereof is coated by Au. A block 501 is formed on the base 401 and protrudes in the upward direction, and the LD 101 described above is fixed on the side of the block 501 and outputs a light in the upward direction. The block 501 is formed to be integral with the base 401, or fixed to be integral with the base 401 by adhesion, etc. The LD 101 is electrically connected to the lead terminals 404 by wire bonding.

An annular holder 502, a flange 503, and an element holder 504 are placed on the base 401 in this order from the bottom. The element holder 504 holds the wavelength conversion element 102 described above. The bottom surface of the cylindrical flange 503 is formed on the upper surface of the holder 502 so that the flange 503 contacts and slides on the holder 502, and is fixed by laser welding etc., after positioning.

The bottom surface of the holder 502 is welded by laser, bonded by wax, or adhered to the base 401 so as to be fixed to the base 401 and to be integral. The height of the holder 502 is set slightly lower than the light emitting point of the LD 101 (a position from where the light is output).

The element holder 504 is formed in the flange 503 so that the position thereof is adjustable in the vertical direction, and is fixed by laser welding, etc., after positioning. The element holder 504 is formed to be cylindrical, and at the center position thereof, a groove 504a (see FIG. 4) is formed in the vertical direction. The wavelength conversion element 102 described above is fixed in and held by the groove 504a of the element holder 504 using epoxy adhesive, etc. The input surface of the wavelength conversion element 102 is located just on the LD 101.

The input surface of the wavelength conversion element 102 fixed to the element holder 504 and the output surface of the LD 101 on the side of the base 401 are kept to be parallel, and the LD 101 and the wavelength conversion element 102 are directly coupled (butt-coupled). The flange 503 can be moved and adjusted in the X-Y plane on the holder 502; in the flange 503, the element holder 504 can be moved and adjusted along the Z axis, independent of the flange 503, thereby enabling easy optical axis adjustment of the LD 101 and the wavelength conversion element 102.

The cylindrical flange 420 is installed on the upper portion of the cap 402 of the laser light source module 400. The ferrule 430 is formed in the flange 420 so that the position thereof is adjustable in the upward direction, and is fixed by laser welding etc., after positioning. The GI lens 104 (114 and 115) constituting the coupling member 104 and the optical fiber 103 (111 and 112) depicted in FIG. 1 are arranged and fixed in the ferrule 430 in this order from the bottom.

The GI lens 104 provided in the ferrule 430 is located by the flange 420 so that the input surface thereof faces the output surface of the wavelength conversion element 102, and the surfaces are kept to be parallel. The flange 420 can be moved and adjusted in the X-Y plane on the cap 402; in the flange 420, the ferrule 430 can be moved and adjusted along the Z axis, independent of the flange 420, thereby enabling easy optical axis adjustment of the GI lens 104 and the wavelength conversion element 102. The GI lens 104 and the wavelength conversion element 102 can be coupled with a given distance L therebetween so as not to be in contact with each other due to deformation caused by the difference in coefficients of thermal expansion of elements, etc., thereby improving the coupling efficiency.

(Second Exemplary Module Configuration of Laser Light Source)

Figure 6:
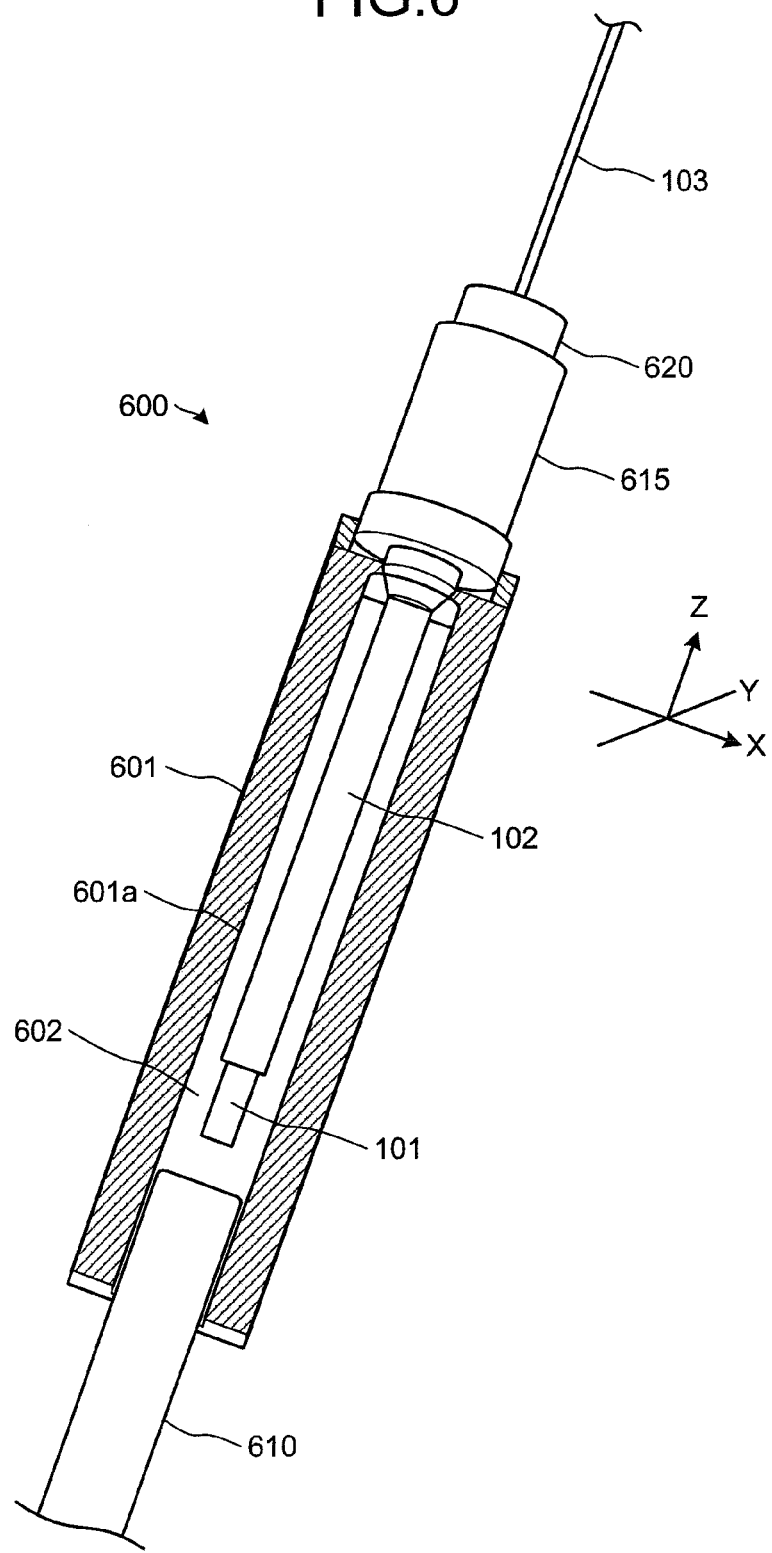
FIG. 6 is a partial cross-section of another exemplary module configuration of the laser light source.

FIG. 6 is a partial cross-section of another exemplary module configuration of the laser light source. In a laser light source module 600 of the exemplary configuration, a housing groove 601a is formed in a metal casing 601, and a planer semiconductor substrate (Si substrate) 602 is provided in the housing groove 601a. The LD 101 and the wavelength conversion element 102 described above are mounted on the Si substrate 602. The LD 101 and the wavelength conversion element 102 can be precisely mounted on the Si substrate 602 by, for example, room-temperature bonding.

A flexible print circuit board (FPC) 610 for driving the laser light source extends from one end of the casing 601. A cylindrical flange 615 is provided on the other end of the casing 601, and a ferrule 620 is installed in the flange 615. The GI lens 104 (114 and 115) constituting the coupling member 104 and the optical fiber 103 (111 and 112) depicted in FIG. 1 are arranged and fixed in the ferrule 620.

The GI lens 104 provided in the ferrule 620 is located by the flange 615 so that the input surface thereof faces the output surface of the wavelength conversion element 102, and the surfaces are kept to be parallel. The flange 615 can be moved and adjusted in the X-Y plane; in the flange 615, the ferrule 620 can be adjusted along the Z axis, independent of the flange 615, thereby enabling easy optical axis adjustment of the GI lens 104 and the wavelength conversion element 102. The GI lens 104 and the wavelength conversion element 102 can be coupled with a given distance L therebetween so as not to be in contact with each other due to deformation caused by the difference in coefficients of thermal expansion of elements, etc., thereby improving the coupling efficiency.

According to the laser light source described above, the converted wave can be output with a simple configuration that includes only the optical fiber 103 that is configured by combining the optical fiber 111 in which the FBG 111a is formed and the optical fiber for visible light 112 that attenuates the component of the fundamental wave output by the LD 101. Further, the GI lens 104 formed by graded-index (GI) optical fibers is provided between the optical fiber 103 and the wavelength conversion element 102, thereby enabling highly efficient coupling with respect to the converted wave output by the wavelength conversion element 102. The GI lens 104 can be small since the GI lens 104 is configured by optical fibers.

(Exemplary Configuration of Mode Converting Unit)

A configuration for improving the coupling efficiency of light between the optical fiber 111 (the first waveguide) and the optical fiber for visible light 112 (the second waveguide) described above is described next. The optical fiber 111 has a different mode field diameter (MFD) from that of the optical fiber for visible light 112. Thus, the coupling efficiency can be improved by providing, between the optical fiber 111 and the optical fiber for visible light 112, a mode converting unit for mode conversion of fibers having different MFDs. The mode converting unit can be configured by GI lens(es), or thermally expanded core (TEC) optical fiber(s).

(Exemplary Configuration for Mode Conversion using GI Lens)

Figure 7:
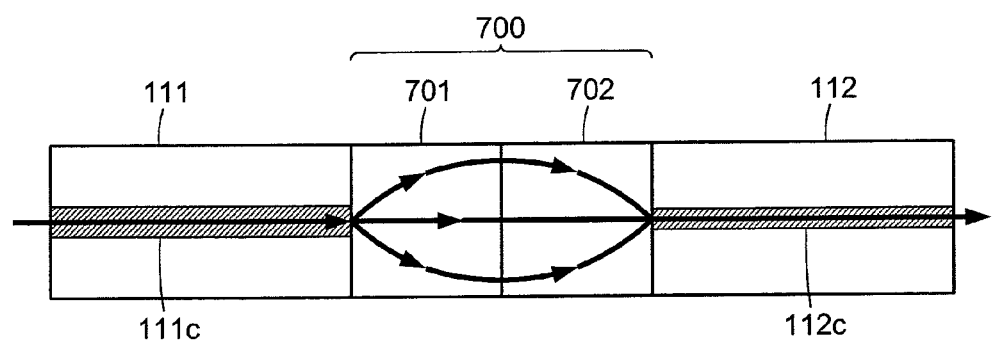
FIG. 7 is a diagram of an exemplary configuration for mode conversion using GI lens.

FIG. 7 is a diagram of an exemplary configuration for mode conversion using GI lens. A GI lens 700 (701 and 702) is provided between the optical fiber 111 and the optical fiber for visible light 112 as the mode converting unit. For example, a core 111c of the optical fiber 111 has a core diameter of 6 μm, while a core 112c of the optical fiber for visible light 112 has a core diameter of 3.5 μm. The GI lens 701 has a small numeric aperture (NA), while the GI lens 702 has a large numeric aperture (NA). The GI lenses 701 and 702 are formed by two short multi-mode fibers having a small and a large NAs, respectively, and operate as a compound lens.

The second harmonic input from the optical fiber 111 becomes a collimated light by passing through the GI lens 701. The diameter of the beam at the focal point after passing through the GI lens 702 becomes the beam diameter of the optical fiber for visible light 112. The coupling efficiency between the optical fiber 111 and the optical fiber for visible light 112 can be improved by providing two GI lenses 701 and 702 between the optical fiber 111 and the optical fiber for visible light 112 as the mode converting unit.

Figure 8:
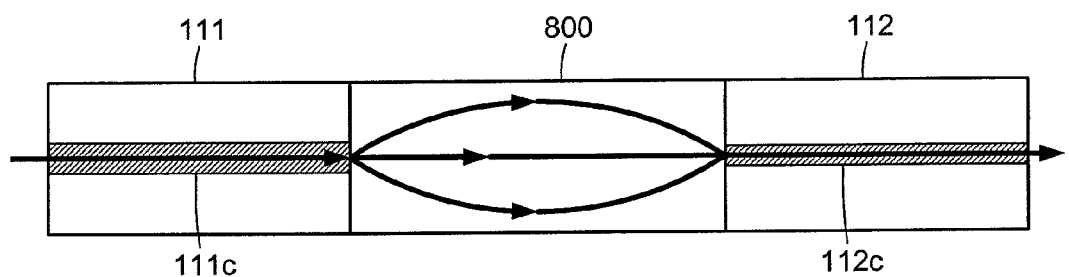
FIG. 8 is a diagram of another exemplary configuration for mode conversion using GI lens.

FIG. 8 is a diagram of another exemplary configuration for mode conversion using GI lens. In the figure, a single GI lens 800 is provided between the optical fiber 111 and the optical fiber for visible light 112 as the mode converting unit. If the single GI lens 800 is used, the diameter of the beam at the focal point of the GI lens 800 does not change and remains to be the same as the beam diameter of the optical fiber 111. However, the refractive index distribution along the diameter changes gradually compared to the single-mode fiber in which the refractive index distribution changes stepwise. Thus, compared to directly bonding the optical fiber 111 and the optical fiber for visible light 112, the GI lens 800 provided between the optical fiber 111 and the optical fiber for visible light 112 can reduce the reflectance at the bonding surface and improve the coupling efficiency. According to the configurations with GI lens described above, the coupling efficiency can be improved while keeping the size small.

(Exemplary Configuration for Mode Conversion using Tec Technology)

Figure 9:
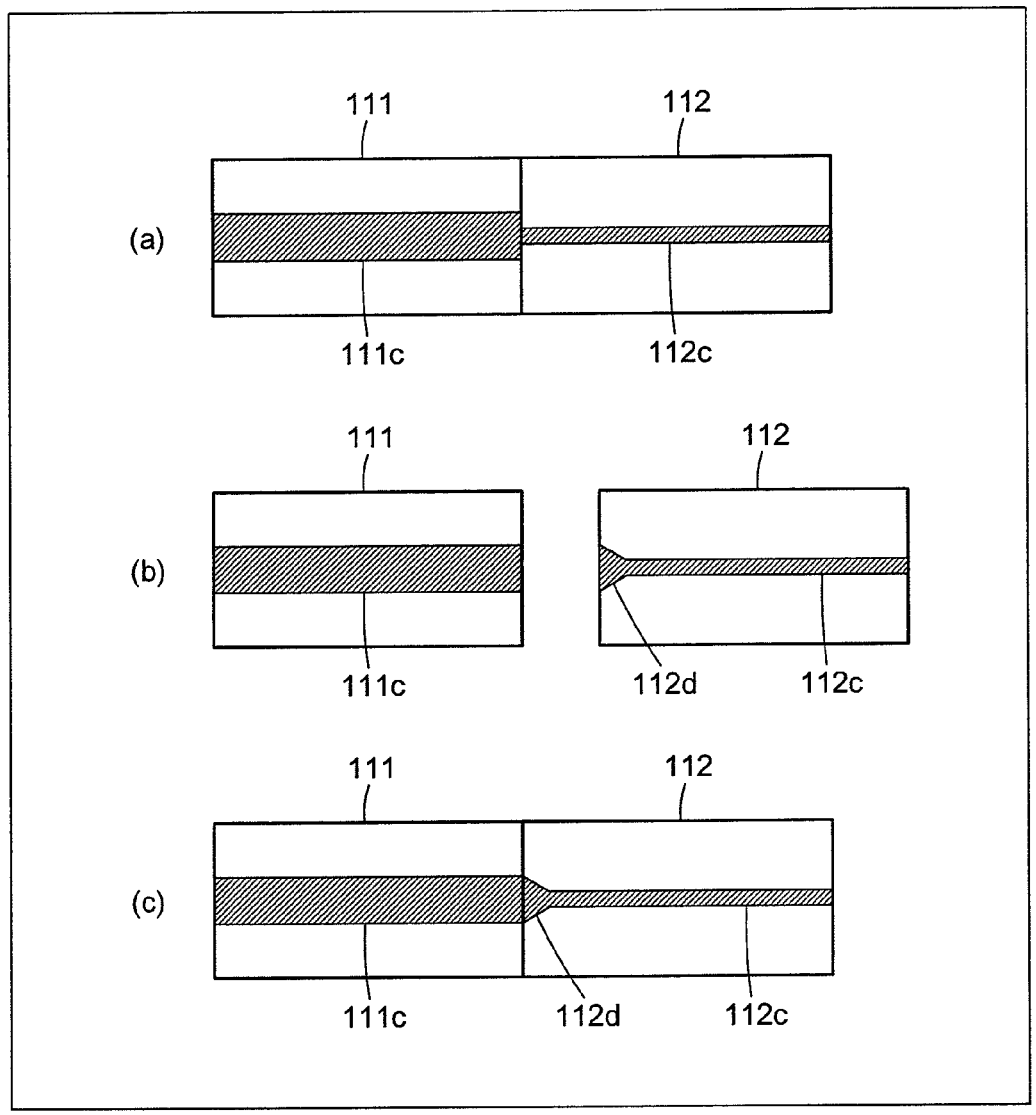
FIG. 9 is a diagram of an exemplary configuration for mode conversion using TEC technology.

FIG. 9 is a diagram of an exemplary configuration for mode conversion using TEC technology. As depicted in (a) of FIG. 9, if the optical fiber 111 and the optical fiber for visible light 112 are directly adhered and bonded, light is reflected due to the unevenness between the cores 111c and 112c, thereby reducing the coupling efficiency. Thus, as depicted in (b) of FIG. 9, the core 112c of the optical fiber for visible light 112 near the bonding surface is subjected to TEC process. Thus, a tapered portion 112d with an increasing opening diameter is formed by core diffusion on the core 112c near the bonding surface. Then, as depicted in (c) of FIG. 9, the optical fiber 111 and the optical fiber for visible light 112 are adhered and bonded. Thus, the core diameter of the core 112c of the optical fiber for visible light 112 can be brought closer to match the core diameter of the core 111c of the optical fiber 111, thereby reducing MFD mismatch adiabatically and improving the coupling efficiency.

Figure 10:
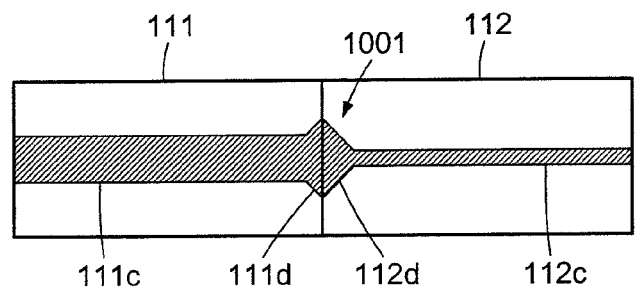
FIG. 10 is a diagram of another exemplary configuration for mode conversion using TEC technology.

FIG. 10 is a diagram of another exemplary configuration for mode conversion using TEC technology. In this exemplary configuration, after the optical fiber 111 and the optical fiber for visible light 112 are adhered and bonded, an adhered portion 1001 may be subjected to TEC process. By the TEC process, tapered portions 111d and 112d are formed near the adhered bonding surface between the optical fiber 111 and the optical fiber for visible light 112, and the core diameters of the cores 111c and 112c are diffused so that the cores 111c and 112c are bonded without unevenness, thereby reducing MFD mismatch adiabatically and improving the coupling efficiency. The configuration in which mode conversion is performed using TEC technology requires no lens, etc., thereby further reducing the size along the optical axis compared to the configuration with GI lens.

(Configuration of Waveguide Provided with Mode Converting Unit)

Figure 11:
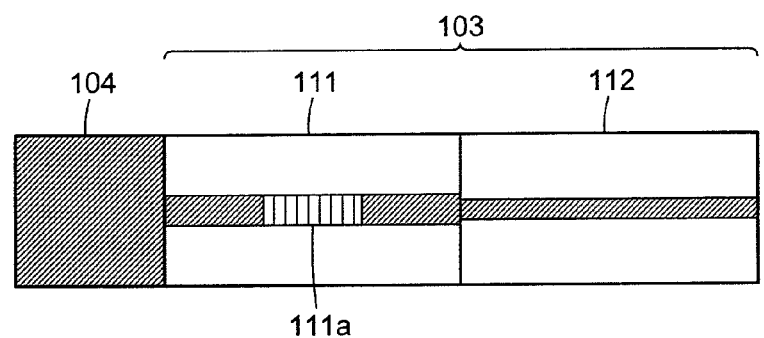
FIG. 11 is a diagram of a configuration in which a waveguide depicted in FIG. 1 is provided with a mode converting unit.
Figure 12:
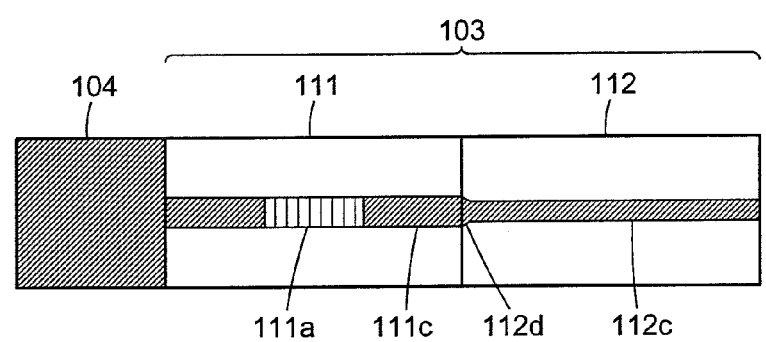
FIG. 12 is a diagram of a configuration in which a waveguide depicted in FIG. 1 is provided with a mode converting unit.
Figure 13:
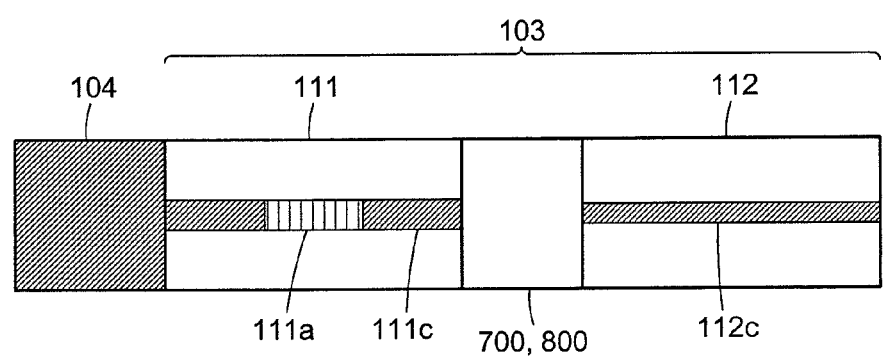
FIG. 13 is a diagram of a configuration in which a waveguide depicted in FIG. 1 is provided with a mode converting unit.

Each of FIGS. 11 to 13 is a diagram of a configuration in which the waveguide depicted in FIG. 1 is provided with a mode converting unit. FIG. 11 corresponds to FIG. 1, and the optical fiber 103 as the waveguide is configured by the optical fiber 111 as the first waveguide and the optical fiber for visible light 112 as the second waveguide that are merely adhered and bonded. In this case, the GI lens 104 formed by graded-index (GI) optical fibers is provided between the optical fiber 103 and the wavelength conversion element 102 (see FIG. 1), thereby enabling highly efficient coupling with respect to the converted wave output by the wavelength conversion element 102. However, the improvement of the overall coupling efficiency is suppressed due to MFD mismatch between the optical fiber 111 and the optical fiber for visible light 112.

In contrast, if the tapered portion 112d is formed as the mode converting unit by the TEC process of the adhered bonding portion of the optical fiber 111 as depicted in FIG. 12, the core diameter of the core 112c of the optical fiber for visible light 112 can be brought closer to the core diameter of the core 111c of the optical fiber 111 as depicted in FIG. 9C, thereby reducing MFD mismatch and improving the coupling efficiency. In addition, the GI lens 104 formed by graded-index (GI) optical fibers is provided between the optical fiber 103 and the wavelength conversion element 102 (see FIG. 1), thereby enabling highly efficient coupling with respect to the converted wave output by the wavelength conversion element 102, and thus improving the overall coupling efficiency.

Although not depicted, the adhered bonding portion of the optical fiber 111 and the optical fiber for visible light 112 may be subjected to the TEC process as depicted in FIG. 10. Thus, the core diameters of the core 111c of the optical fiber 111 and the core 112c of the optical fiber for visible light 112 can be brought closer to each other, thereby reducing MFD mismatch, improving the coupling efficiency, enabling highly efficient coupling with respect to the converted wave output by the wavelength conversion element 102 by the GI lens 104, and improving the overall coupling efficiency.

Even when the GI lens 700 depicted in FIG. 7 or the GI lens 800 depicted in FIG. 8 is provided as the mode converting unit, the coupling efficiency between the optical fiber 111 and the optical fiber for visible light 112 can be similarly improved by the GI lens 700 (701 and 702) or 800, highly efficient coupling with respect to the converted wave output by the wavelength conversion element 102 is enabled by GI lens 104, and the overall coupling efficiency can be improved.

In FIGS. 11 to 13, the optical fiber 111 is provided with the GI lens 104 to enable highly efficient coupling with respect to the converted wave output by the wavelength conversion element 102. However, the GI lens 104 may be omitted depending on intended use. Even when the GI lens 104 is not provided, the mode converting unit provided at the adhered bonding portion of the optical fiber 111 and the optical fiber for visible light 112 can reduce MFD mismatch in the optical fiber 103 as the waveguide and improve the coupling efficiency.

According to the configuration with the mode converting unit described above, the converted wave can be output with a simple configuration that includes only the optical fiber 103 that is configured by combining the optical fiber 111 in which the FBG 111a is formed and the optical fiber for visible light 112 that attenuates the component of the fundamental wave output by the LD 101. Further, the GI lens 104 formed by graded-index (GI) optical fibers is provided between the optical fiber 103 and the wavelength conversion element 102, thereby enabling highly efficient coupling with respect to the converted wave output by the wavelength conversion element 102. The GI lens 104 can be small since the GI lens 104 is configured by optical fibers. Further, the mode converting unit provided at the adhered bonding portion of the optical fiber 111 and the optical fiber for visible light 112 can reduce MFD mismatch in the optical fiber 103 as the waveguide and improve the overall coupling efficiency of the module.

(Third Exemplary Module Configuration of Laser Light Source)

Figure 14:
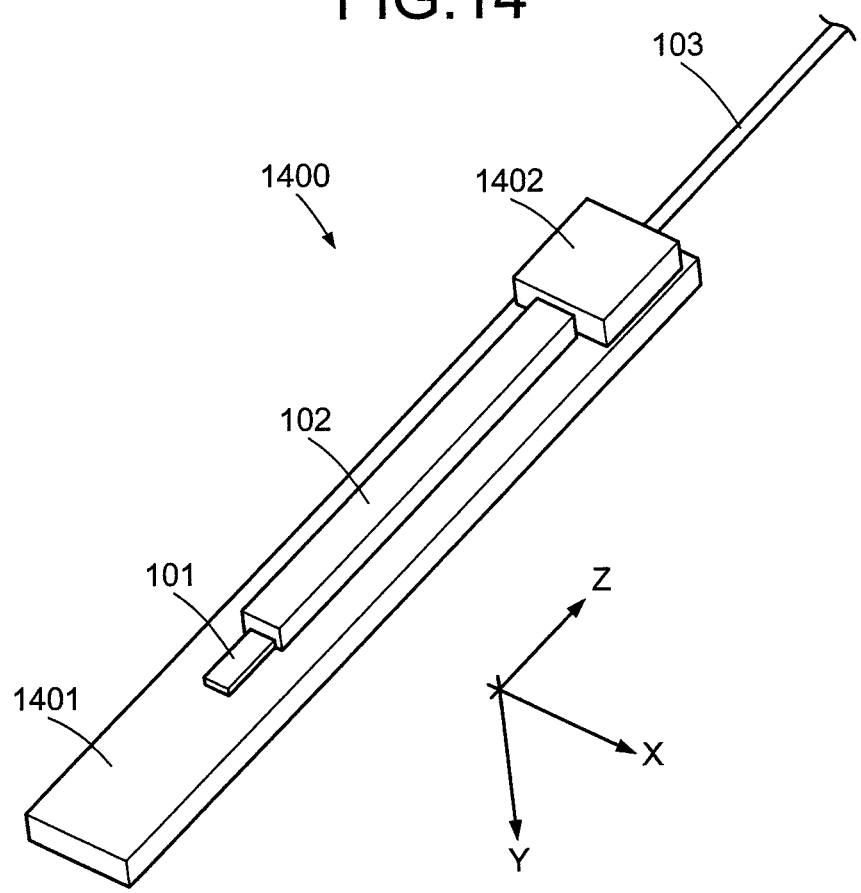
FIG. 14 is a partial cross-section of another exemplary module configuration of the laser light source.

FIG. 14 is a partial cross-section of another exemplary module configuration of the laser light source. In a laser light source module 1400 in this exemplary configuration, the LD 101 described above, the periodically poled lithium niobate (PPLN) as the wavelength conversion element 102, and an optical-fiber fixing unit 1402 that fixes and holds the edge portion of the optical fiber 103 are provided on a rectangular (planer) semiconductor substrate (Si substrate) 1401 by face-down bonding.

Figure 15A:
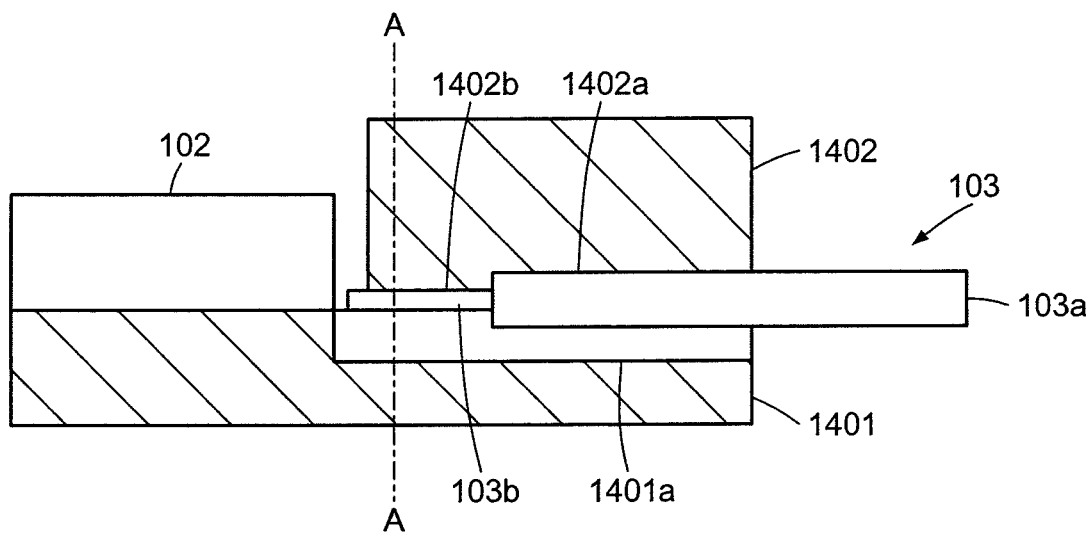
FIG. 15A is a partial side cross-section of FIG. 14.
Figure 15B:
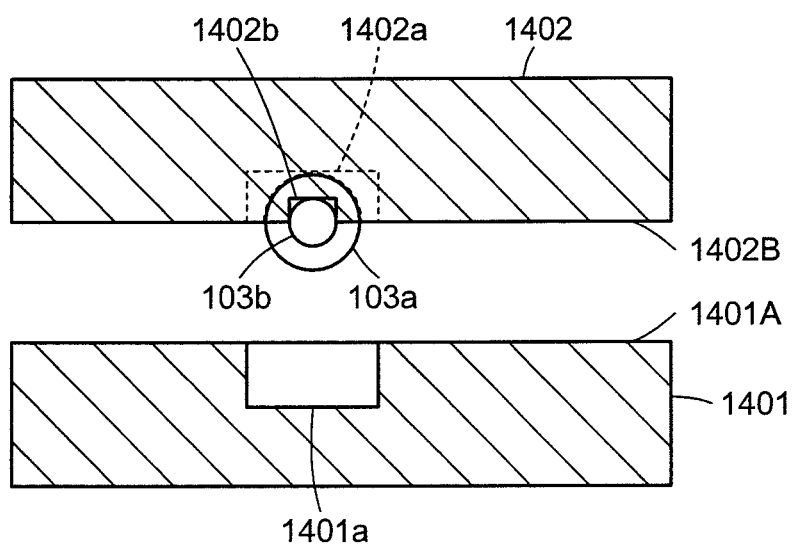
FIG. 15B is a cross-section of FIG. 15A along A-A line.

FIG. 15A is a partial side cross-section of FIG. 14; FIG. 15B is a cross-section of FIG. 15A along A-A line. The optical-fiber fixing unit 1402 is formed by a Si substrate and formed as a block. A housing groove 1402a corresponding to the diameter of a covered portion 103a of the optical fiber 103 and a housing groove 1402b corresponding to the diameter of an uncovered portion 103b of the optical fiber 103 are formed on the bottom surface 1402B (a surface facing the Si substrate 1401) of the optical-fiber fixing unit 1402. The first waveguide (the optical fiber 111), the second waveguide (the optical fiber for visible light 112), and the mode converting unit described above are provided on a portion of the uncovered portion 103b. The first waveguide, the second waveguide, and the mode converting unit described above may be formed so as to be included in the covered portion 103a.

The edge portion of the optical fiber 103 is bonded and fixed by resin adhesive etc., with the covered portion 103a thereof being housed in the housing groove 1402a. The uncovered portion 103b having a given length from the covered portion 103a is exposed at the edge portion of the optical fiber 103. The uncovered portion 103b is housed in the housing groove 1402b, and bonded and fixed by resin adhesive etc. Thus, the edge portion of the optical fiber 103 is fixed in the optical-fiber fixing unit 1402. At this point, the optical axis (the center position) of the edge portion of the optical fiber 103 matches the position of the bottom surface 1402B of the optical-fiber fixing unit 1402 as depicted in FIG. 15B.

The optical-fiber fixing unit 1402 is bonded and fixed to the edge portion of the Si substrate 1401. An adjustment groove 1401a that houses the optical fiber 10 without being in contact with the optical fiber 103 is formed on the upper surface 1401A (a surface facing the optical-fiber fixing unit 1402) of the Si substrate 1401. The adjustment groove 1401a is formed so as to have a diameter larger than the diameter of the optical fiber 103 so that the optical-fiber fixing unit 1402 can be moved vertically and horizontally (along X, Y, and Z axis of FIG. 14) above the Si substrate 1401 for optical axis adjustment.

The assembly of the laser light source module 1400 having the above configuration is described. The LD 101 is placed on and fixed to the Si substrate 1401. The wavelength conversion element 102 is placed while adjusting the optical axis by monitoring the fundamental wave output from the LD 101 and the converted light by a CMOS camera, an optical detector, etc. The optical-fiber fixing unit 1402 is placed, while monitoring the fundamental wave and the converted light, on the Si substrate 1401 at the position to where the wavelength conversion element 102 outputs the light. In this state, the entire bottom surface 1402B or several points of the bottom surface 1402B of the optical-fiber fixing unit 1402 contact(s) the upper surface 1401A of the Si substrate 1401 depicted in FIG. 15B so that the optical-fiber fixing unit 1402 can slide on the Si substrate 1401. In this state, the covered portion 103a and the uncovered portion 103b of the optical fiber 103 are fixed in the housing grooves 1402a and 1402 of the optical-fiber fixing unit 1402, respectively, and the height of the tip of the optical fiber 103 matches the height of the output light from the wavelength conversion element 102 (state depicted in FIG. 15A).

Thus, the optical axis of the output light from the wavelength conversion element 102 and the optical axis of the optical fiber 103 can be adjusted by moving the optical-fiber fixing unit 1402 along the X axis and/or the Y axis of FIG. 14. The assembly of the module is completed by bonding and fixing the optical-fiber fixing unit 1402 to the Si substrate 1401 by regin, solder, etc.

The LD 101 and the wavelength conversion element 102 can be precisely mounted on the Si substrate 1401 by, for example, room-temperature bonding.

According to the laser light source module described above, optical elements can be precisely mounted on a planer Si substrate, and a small and inexpensive laser light source can be obtained with a minimum number of elements. Further, optical axis adjustment of optical elements during assembly can be easily performed.

The present invention can be applied to not only a configuration in which the wavelength is locked by an external oscillator, but also a configuration in which the frequency is locked by feeding back a part of the fundamental wave using pulse laser.

As described above, the laser light source according to the present invention is useful for a laser light source with a wavelength conversion element that converts the fundamental wave and outputs the converted wave, and in particular, for a small and highly efficient laser light source and for a light source of an optical communication system and/or a display system (a laser projector, etc.) that include the laser light source.

According to the configuration described above, the fundamental wave output from the wavelength conversion element is fed back by the diffraction grating formed in the first waveguide, and the wavelength or the frequency of the fundamental wave is locked. The converted wave can be efficiently output from the second waveguide since the second waveguide attenuates the component of the fundamental wave.

Although "graded-index" can be also called "gradient-index", "graded-index" is used herein.

According to the configuration described above, with a small size, the wavelength conversion element and the first waveguide can be efficiently coupled.

"GI" stands for "graded index" or "gradient-index," and the GI lens is formed by a multi-mode fiber that has a refractive index distribution along the diameter thereof.

According to the configuration described above, the output light of the wavelength conversion element can be efficiently coupled and the size can be reduced by using two GI lenses.

According to the configuration described above, reflection of light at the input surface can be prevented and the coupling efficiency can be improved.

According to the configuration described above, the polarization state can be maintained.

According to the configuration described above, the mode converting unit can perform mode conversion between the first waveguide and the second waveguide having different mode field diameters, and the coupling efficiency can be improved.

According to the configuration described above, mode conversion can be performed between the first waveguide and the second waveguide having different mode field diameters, and with a small size, the first waveguide and the second waveguide can be efficiently coupled.

According to the configuration described above, mode conversion can be performed between the first waveguide and the second waveguide having different mode field diameters, and with a small size (without using elements for spatial optical system), the first waveguide and the second waveguide can be efficiently coupled.

According to the configuration described above, the orientation of the base and the optical axis can be independently adjusted, and optical axis adjustment between the laser element and the wavelength conversion element and that between the wavelength conversion element and the first waveguide can be easily performed.

According to the configuration described above, the laser element and the wavelength conversion element can be precisely mounted on the semiconductor substrate, and optical axis adjustment between the wavelength conversion element and the first waveguide can be easily performed.

According to the configuration described above, the number of elements can be reduced and the size can be further reduced, the laser element and the wavelength conversion element can be precisely mounted on the semiconductor substrate, and the assembly can be made easier.

According to the present invention, the fundamental wave that has not been converted by the wavelength conversion element can be suppressed from being output, and the size can be reduced.

What is claimed is:

1. A laser light source comprising:
   a laser element that outputs a fundamental wave as infrared light;
   a wavelength conversion element to which the fundamental wave is input and that wavelength-converts at least a portion of the input fundamental wave to a converted wave having a wavelength shorter than the fundamental wave and being visible light;
   a first waveguide that guides an output wave from the wavelength conversion element;
   a second waveguide that is separate from and coupled to the first waveguide and attenuates and guides a component of the fundamental wave included in the output wave from the first waveguide and outputs the converted wave;
   a diffraction grating that is formed in the first waveguide and locks a wavelength or a frequency of the fundamental wave output from the laser element by feeding back the fundamental wave output from the wavelength conversion element.

2. The laser light source according to claim 1, wherein the first waveguide has a diameter for guiding the fundamental wave in single mode, and the second waveguide has a diameter for guiding the converted wave in single mode.

3. The laser light source according to claim 2, further comprising a graded-index optical fiber functioning as a coupling member that optically couples the wavelength conversion element and the first waveguide.

4. The laser light source according to claim 3, wherein the graded-index optical fiber includes
   a first GI lens that is located on a side of the wavelength conversion element and has a numeric aperture NA1; and
   a second GI lens that is connected to the first GI lens and has a numeric aperture NA2 smaller than the first GI lens.

5. The laser light source according to claim 4 further comprising a mode converting unit that is provided between the first waveguide and the second waveguide for mode conversion of different mode field diameters.

6. The laser light source according to claim 3, wherein an input surface of the graded-index optical fiber is formed so as to be skewed with respect to an optical axis of the optical fiber.

7. The laser light source according to claim 6 further comprising a mode converting unit that is provided between the first waveguide and the second waveguide for mode conversion of different mode field diameters.

8. The laser light source according to claim 3, wherein an input surface of the graded-index optical fiber is formed so as to have a sphere.

9. The laser light source according to claim 8 further comprising a mode converting unit that is provided between the first waveguide and the second waveguide for mode conversion of different mode field diameters.

10. The laser light source according to claim 3 further comprising a mode converting unit that is provided between the first waveguide and the second waveguide for mode conversion of different mode field diameters.

11. The laser light source according to claim 2, wherein the first waveguide and the second waveguide are polarization maintaining fibers.

12. The laser light source according to claim 11 further comprising a mode converting unit that is provided between the first waveguide and the second waveguide for mode conversion of different mode field diameters.

13. The laser light source according to claim 2, further comprising a mode converting unit that is provided between the first waveguide and the second waveguide for mode conversion of different mode field diameters.

14. The laser light source according to claim 13, wherein the mode converting unit is a single GI lens or a plural GI lenses having different numeric apertures.

15. The laser light source according to claim 13, wherein the mode converting unit is a tapered portion formed by thermally expanded core (TEC) process on a core near an adhered bonding portion of the first waveguide and the second waveguide so that core diameters match with each other.

16. The laser light source according to claim 2, further comprising:
 a base that holds the laser element;
 a holding member that is provided on the base and holds the wavelength conversion element;
 a cap of the base and the holding member; and
 a ferrule that is installed to an opening of the cap and fixes the first waveguide to which a light of the wavelength conversion element is input, the second waveguide, and the coupling member.

17. The laser light source according to claim 2, further comprising:
 a casing in which a housing groove is formed;
 a semiconductor substrate that is housed in the housing groove and on which the laser element and the wavelength conversion element are mounted; and
 a ferrule that is installed to an opening of the casing and fixes the first waveguide to which a light of the wavelength conversion element is input, the second waveguide, and the coupling member.

18. The laser light source according to claim 2, further comprising:
 a semiconductor substrate on which the laser element and the wavelength conversion element are mounted; and
 an optical-fiber fixing unit that is bonded to the semiconductor substrate and fixes the first waveguide to which a light of the wavelength conversion element is input and the second waveguide.

19. The laser light source according to claim 2, wherein the fundamental wave in single mode is near infrared light, and the converted wave is visible light.

\* \* \* \* \*